United States Patent
Hanson et al.

(10) Patent No.: US 10,147,642 B1
(45) Date of Patent: Dec. 4, 2018

(54) BARRIER FOR PREVENTING EUTECTIC BREAK-THROUGH IN THROUGH-SUBSTRATE VIAS

(71) Applicant: MACOM Technology Solutions Holdings, Inc., Lowell, MA (US)

(72) Inventors: Allen W. Hanson, Cary, NC (US); Rajesh Baskaran, Dracut, MA (US); Timothy E. Boles, Tyngsboro, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 432 days.

(21) Appl. No.: 13/870,161

(22) Filed: Apr. 25, 2013

(51) Int. Cl.
*H01L 21/78* (2006.01)
*H01L 21/768* (2006.01)
*H01L 23/532* (2006.01)

(52) U.S. Cl.
CPC .......... *H01L 21/7685* (2013.01); *H01L 21/78* (2013.01); *H01L 23/53252* (2013.01)

(58) Field of Classification Search
CPC H01L 21/76898; H01L 21/78; H01L 21/4763
USPC ...................................................... 257/621
See application file for complete search history.

(56) References Cited

U.S. PATENT DOCUMENTS

| | | | | |
|---|---|---|---|---|
| 6,091,148 A | * | 7/2000 | Givens et al. | 257/750 |
| 2002/0064922 A1 | * | 5/2002 | Lin | 438/381 |
| 2002/0076924 A1 | * | 6/2002 | Koo | 438/665 |
| 2004/0005771 A1 | * | 1/2004 | Fan | H01L 24/11 438/613 |
| 2007/0249163 A1 | * | 10/2007 | Oikawa | 438/637 |
| 2008/0079121 A1 | * | 4/2008 | Han | H01L 21/76898 257/621 |
| 2009/0224405 A1 | * | 9/2009 | Chiou et al. | 257/758 |
| 2010/0314758 A1 | * | 12/2010 | Wu | H01L 21/76898 257/737 |
| 2011/0254044 A1 | * | 10/2011 | Kuo et al. | 257/99 |

* cited by examiner

*Primary Examiner* — Thao X Le
*Assistant Examiner* — Geoffrey Ida
(74) *Attorney, Agent, or Firm* — Thomas | Horstemeyer, LLP; Michael J. D'Aurelio; Jason M. Perilla (57) ABSTRACT

A method involving a barrier for preventing eutectic break-through in through-substrate vias is disclosed. The method generally includes steps (A) to (D). Step (A) may form one or more vias through a substrate. The substrate generally comprises a semiconductor. Step (B) may form a first metal layer. Step (C) may form a barrier layer. The barrier layer generally resides between the vias and the first metal layer. Step (D) may form a second metal layer. The second metal layer may be in electrical contact with the first metal layer through the vias and the barrier layer.

20 Claims, 8 Drawing Sheets

BARRIER FOR PREVENTING EUTECTIC BREAK-THROUGH IN THROUGH-SUBSTRATE VIAS

FIELD OF THE INVENTION

The present invention relates to semiconductor processing generally and, more particularly, to a method and/or apparatus for implementing a barrier for preventing eutectic break-through in through-substrate vias.

BACKGROUND OF THE INVENTION

Through-substrate vias are conventionally used to realize high-frequency and high-performance transistors and integrated circuits. A conventional die attachment method for such transistors and integrated circuits is to use a gold-silicon eutectic. The gold-silicon eutectic approach has a reduced variability over other methods, such as approaches employing gold-tin preforms. Although the gold-silicon eutectic approach works well, an introduction of the through-substrate vias has been found, in practice, to impose a limit on a range of temperatures and dwell/scrub times that can be utilized during the die attachments. At sufficient temperature and/or time, the front-side contact interfaces of the through-substrate vias can be breached by the gold-silicon eutectic alloy. Therefore, the front-side contact interfaces become compromised. The breaching is especially limiting with multi-die assemblies.

It would be desirable to implement a barrier for preventing eutectic break-through in through-substrate vias.

SUMMARY OF THE INVENTION

The present invention concerns a method involving a barrier for preventing eutectic break-through in through-substrate vias. The method generally includes steps (A) to (D). Step (A) may form one or more vias through a substrate. The substrate generally comprises a semiconductor. Step (B) may form a first metal layer. Step (C) may form a barrier layer. The barrier layer generally resides between the vias and the first metal layer. Step (D) may form a second metal layer. The second metal layer may be in electrical contact with the first metal layer through the vias and the barrier layer.

The objects, features and advantages of the present invention include providing a barrier for preventing eutectic break-through in through-substrate vias that may (i) prevent metals used in through-substrate vias from breaching front-side contact layers, (ii) prevent a flow of a gold-silicon eutectic alloy through the vias to a front surface of the substrate, (iii) limit alloying in predetermined areas and/or (iv) be implemented with high-frequency devices.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments utilize a barrier (or blocking) layer to prevent a flow of a eutectic alloy (e.g., gold-silicon) from a back surface of a substrate through vias to a front surface of the substrate. The barrier layer generally comprises multiple layers of titanium, tungsten, nitrogen and gold (e.g., TiW/TiWN/TiW/Au) alloys (or compounds) and/or a titanium, tungsten, nitrogen and copper (e.g., TiW/TiWN/TiW/TiW/Cu) alloys (or compounds). Other types and numbers of alloys may be implemented to meet the criteria of a particular application. The eutectic alloy generally concerns a ratio of components that solidifies at a lower temperature than any other ratio of the components.

Figure 1:
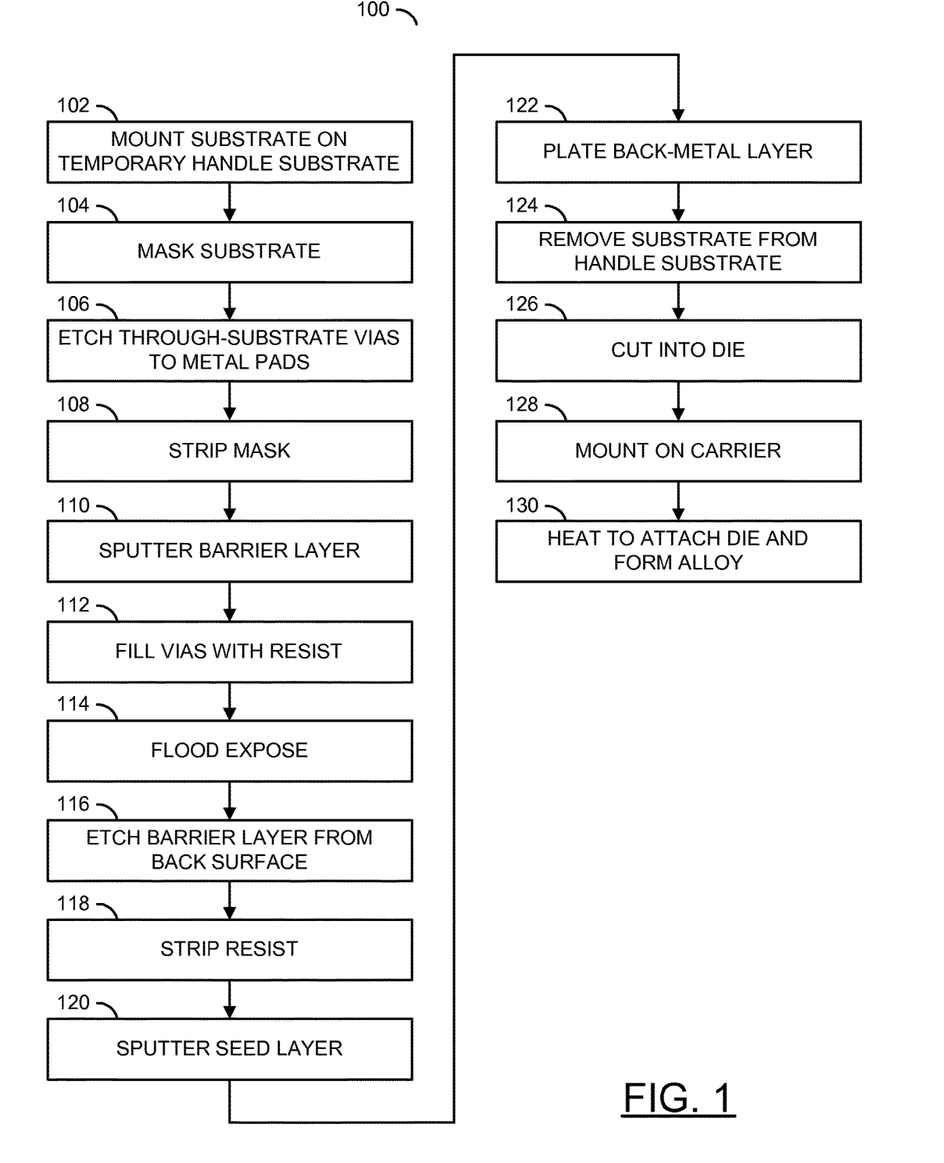
FIG. 1 is a flow diagram of a fabrication method in accordance with a preferred embodiment of the present invention.

Referring to FIG. 1, a flow diagram of a fabrication method 100 is shown in accordance with a preferred embodiment of the present invention. The method (or process) 100 generally implements a fabrication method used to create one or more die having through-substrate vias. The die may include, but are not limited to, high-frequency and/or high-performance transistors and integrated circuits.

The method 100 generally comprises a step (or state) 102, a step (or state) 104, a step (or state) 106, a step (or state) 108, a step (or state) 110, a step (or state) 112, a step (or state) 114, a step (or state) 116, a step (or state) 118, a step (or state) 120, a step (or state) 122, a step (or state) 124, a step (or state) 126, a step (or state) 128, a step (or state) 130. The steps 102-130 may be implemented using common semiconductor fabrication equipment.

Figure 2:
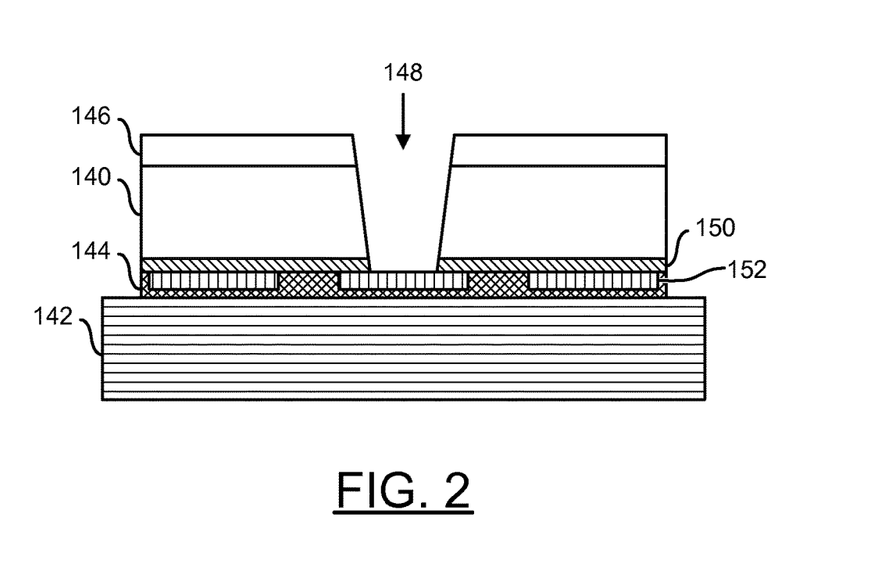
FIGS. 2-7 are cross-sectional diagrams of a wafer during the steps of the fabrication method of FIG. 1.

Referring to FIG. 2, a cross-sectional diagram of a wafer during the steps 102-106 is shown. In the step 102, a semiconductor substrate (or wafer) 140 may be flip mounted to a temporary handle substrate 142. In some embodiments, the substrate 140 generally comprises a silicon crystal. The substrate 140 may be a low doped, high-resistivity substrate. In some embodiments, the dopant may be an n-type dopant. In other embodiments, the dopant may be a p-type dopant. The substrate 140 may be very lightly doped "n--" or "p--" (e.g., <$10^{14}$ atoms/centimeters cubed (cm$^3$)), lightly doped "n-" or "p-" (e.g., $10^{14}$ to $10^{16}$ atoms/cm$^3$) or even an undoped intrinsic substrate. At the time of the mounting, the substrate 140 (or an epitaxial layer) may already have electronic circuitry fully or partially fabricated in (on) a front surface. The handle substrate 142 may be fabricated in sapphire or other suitable handling material. An adhesion layer 144 may provide a temporary planarization and bonding material between the substrate 140 and the handle substrate 142.

In the step 104, a mask layer (e.g., photoresist) 146 may be deposited and patterned on a back surface of the substrate 140. One or more through-substrate vias 148 may be etched in the step 106. The vias 148 generally extend from the back surface of the substrate 140 to respective pads formed in a front-surface metal layer (or conductor) 152. If an epitaxial layer 150 (e.g., gallium nitride, gallium arsenide, or aluminum gallium nitride: $Al_xGa_{1-x}N$ where $0 \leq x \leq 1$) exists on the front surface of the substrate 140, the vias 148 generally extend through the epitaxial layer 150 to reach the pads in the front-surface metal layer 152. In some embodiments, the epitaxial layer 150 may be two microns thick. Other epitaxial thicknesses and other epitaxial materials may be implemented to meet the criteria of a particular application.

Figure 3:
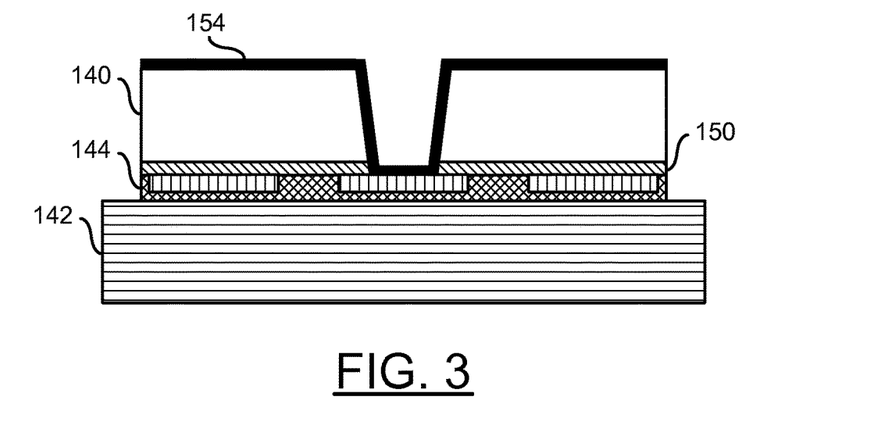

Referring to FIG. 3, a cross-sectional diagram of the wafer during the steps 108-110 is shown. In the step 108, the mask layer 146 is stripped to leave the back side of the substrate 140 uncovered. A barrier layer 154 is sputtered onto the back side of the substrate 140 in the step 110. The barrier layer 154 generally forms a liner along the inside walls of the vias 148. The barrier layer may comprise one or more layers of various alloys and/or mixtures. An initial mixture layer may be, for example, a titanium-tungsten (e.g., TiW) layer. A subsequent layer of titanium-tungsten-nitride (e.g., TiWN) may be deposited. Next, a layer of titanium-gold (e.g., Ti/Au) may be sputtered.

The different materials in the barrier layer 154 may serve several purposes. The sputtered gold layer generally aids in bonding the barrier layer 154 to a later-plated back-metal (e.g., gold) layer. The titanium generally acts as an adhesive layer to the barrier layer and the substrate. The TiWN generally acts as a barrier that prevents the gold along the via sidewalls from alloying with the silicon of the substrate 140 and from mixing with the metal layer 152. The barrier layer 154 may be designed to prevent the formation of the gold-silicon eutectic with the silicon along the via sidewalls. Additionally, the barrier layer 154 generally blocks the intermixing of the metals from the conductive front-side metal layer 152 with any gold-silicon eutectic. Such intermixing is known to degrade electrical performance.

Figure 4:
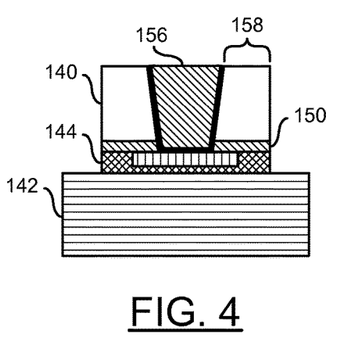

Referring to FIG. 4, a cross-sectional diagram of the wafer during the steps 112-116 is shown. In the step 112, the vias 148 may be filled with a photoresist 156 and exposed in the step 114. In the step 116, the barrier layer 154 is generally etched from the back side of the substrate 140. The etching is intended to remove the barrier layer 154 from all non-via areas 158 of the back (outside) surface of the substrate 140 or from selected portions of the back surface.

Figure 5:
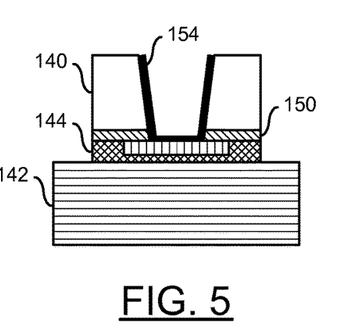

Referring to FIG. 5, a cross-sectional diagram of the wafer during the step 118 is shown. In the step 118, the photoresist is stripped to reopen the vias 148. The stripping generally leaves the inside walls of the vias 148 and the exposed areas 158 on the outside surface of the substrate 140 available for subsequent processing.

Figure 6:
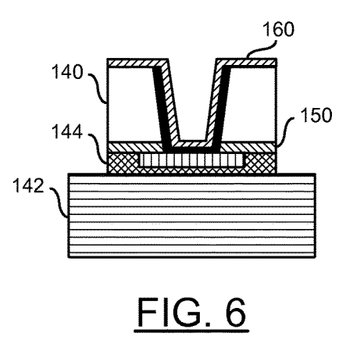

Referring to FIG. 6, a cross-sectional diagram of the wafer during the step 120 is shown. In the step 120, a seed layer 160 may be sputtered to the back side of the substrate 140. In some embodiments, the seed layer 160 generally comprises a titanium-gold (e.g., TiAu) layer stack. Since the resist 156 has been removed from the vias 148, the seed layer 160 may also be deposited on the barrier layer 154.

Figure 7:
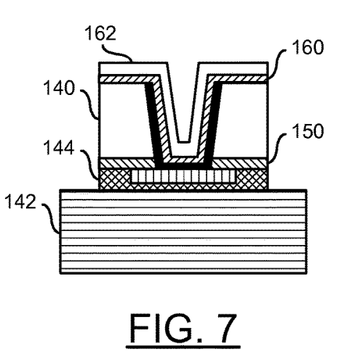

Referring to FIG. 7, a cross-sectional diagram of the wafer during the step 122 is shown. In the step 122, the seed layer 160 is used to plate a back-metal layer 162 on the back surface of the substrate 140 and into the vias 148. In some embodiments, the back-metal layer 162 generally comprises a gold layer. Other back-metal materials may be used to meet the criteria of a particular application.

Returning to FIG. 1, the substrate 140 may be removed from the handle substrate 142 and the adhesive layer 144 removed in the step 124. The substrate 140 may be cut into individual die (e.g., transistors or integrated circuits) in the step 126. The die are generally mounted on a carrier in the step 128 with the back-metal layer 162 in direct contact with metalization on the carrier. In the step 130, the die and carrier may be heated to bond the die to the carrier. The carrier may include, but is not limited to, a package flange, a printed circuit board and a ceramic carrier.

For a gold type back-metal layer 162 and a silicon type substrate 140, the heating generally involves temperatures in the range of 363° Celsius to 450° Celsius. Attach times generally range from 20 to 60 seconds. However, the system has been verified to hold off intermixing for up to 3 hours. The heat may cause the back-metal layer 162 to form a eutectic (e.g., a gold-silicon eutectic) with the substrate 140 in a liquid state. The eutectic generally forms in the exposed areas 158 on the back surface of the substrate 140. The liquid-state eutectic may also cause a bond to form between the metalized areas on the carrier and the substrate 140. The alloying of the back-metal layer 162 with the substrate 140 may also provide a strong mechanical interface (or attachment) to prevent the back-metal layer 162 from delaminating from the substrate 140 over time and/or mechanical stress.

Figure 8:
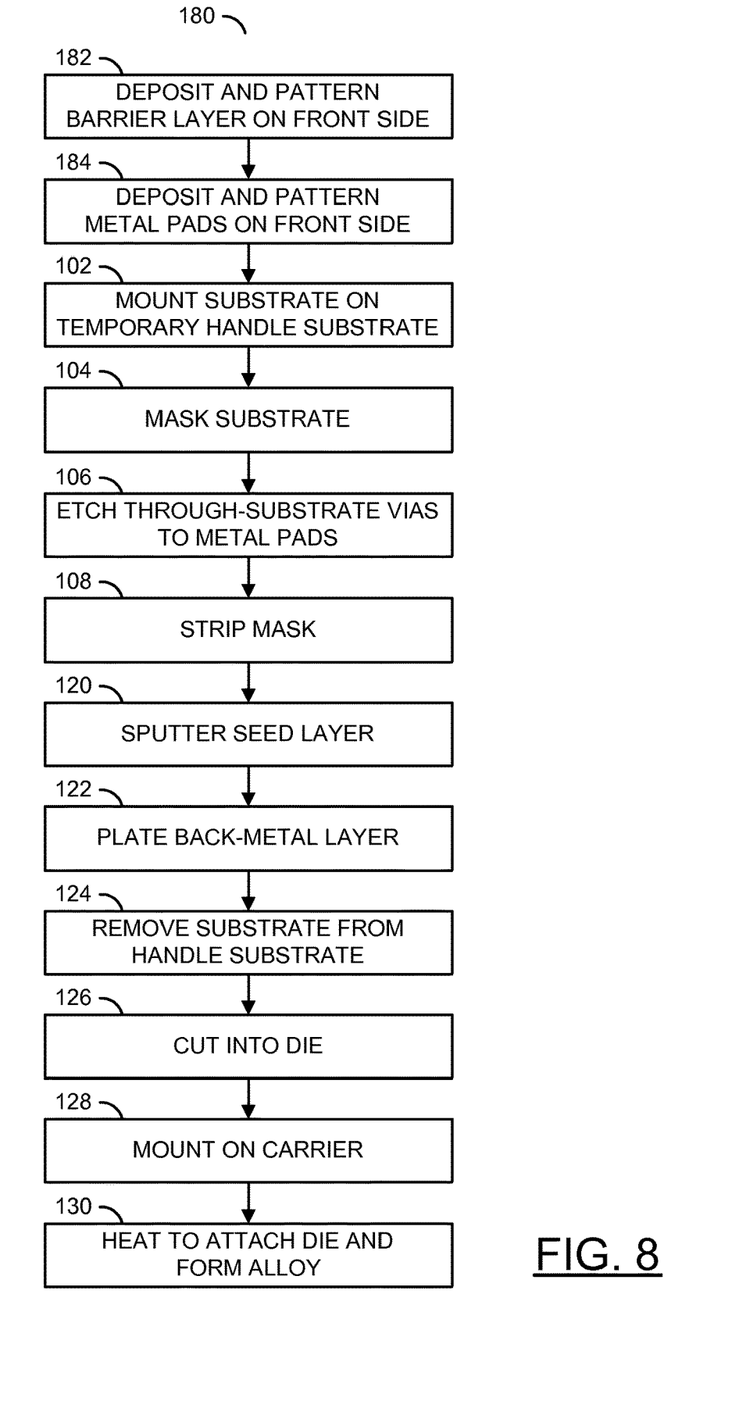
FIG. 8 is a flow diagram of a fabrication method.

Referring to FIG. 8, a flow diagram of another fabrication method 180 is shown. The method (or process) 180 generally implements a fabrication method used to create one or more die having through-substrate vias. The die may include, but are not limited to, high-frequency and/or high-performance transistors and integrated circuits. The method 180 may be a variation of the method 100.

The method 180 generally comprises a step (or state) 182, a step (or state) 184, the step 102, the step 104, the step 106, the step 108, the step 120, the step 122, the step 124, the step 126, the step 128 and the step 130. The steps 182-184, 102-108 and 120-130 may be implemented using common semiconductor fabrication equipment.

Figure 9:
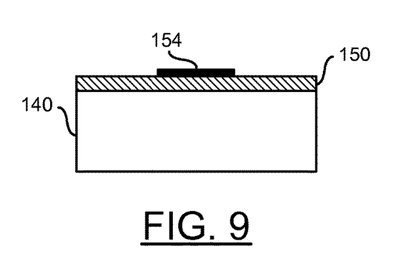
FIGS. 9-16 are cross-sectional diagrams of the wafer during the steps of the fabrication method of FIG. 8.

Referring to FIG. 9, a cross-sectional diagram of the wafer during the step 182 is shown. In the step 182, the barrier layer 154 may be deposited and patterned on the epitaxial layer 150. In the case that no epitaxial layer 150 is implemented, the barrier layer 154 may be deposited and patterned on the substrate 140.

Figure 10:
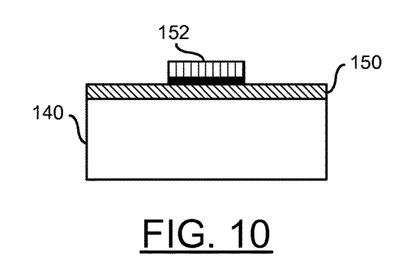

Referring to FIG. 10, a cross-sectional diagram of the wafer during the step 184 is shown. In the step 184, the metal layer 152 may be deposited and patterned on the barrier layer 154.

Figure 11:
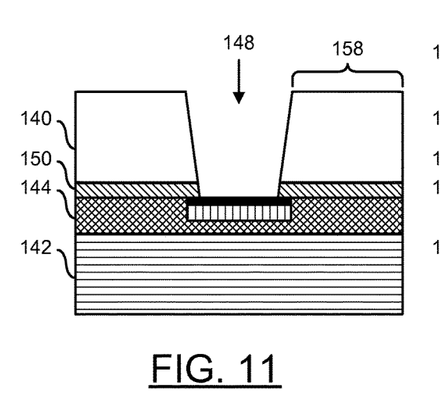

Referring to FIG. 11, a cross-sectional diagram of the wafer during the steps 102-108 is shown. The substrate 140 may subsequently be flipped and mounted to the handling substrate 142 in the step 102. In the step 104-108, the mask layer may be formed, the through-substrate vias 148 etched and the mask layer stripped, as in the method 100. Since the barrier layer 140 is not sputtered onto the back surface of the substrate 140 as in the method 100, the resist, exposure, etching and stripping steps 112-118 of the method 100 may be skipped in the method 180.

Figure 12:
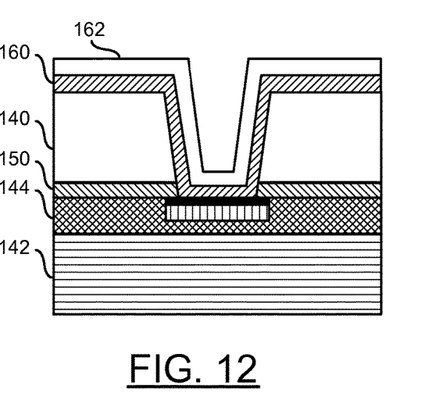

Referring to FIG. 12, a cross-sectional diagram of the wafer during the steps 120-130 is shown. In the step 120, the seed layer 160 may be sputtered onto the back surface of the substrate 140 and into the vias 148. The steps 122 to 130 of the method 180 may be similar to the same steps in the method 100. The back-metal layer 162 may be plated and the substrate 140 removed from the handle substrate 142 in the step 122 and 124. The substrate 140 may be cut into die, mounted and attached/alloyed in the steps 126, 128 and 130, respectively.

Figure 13:
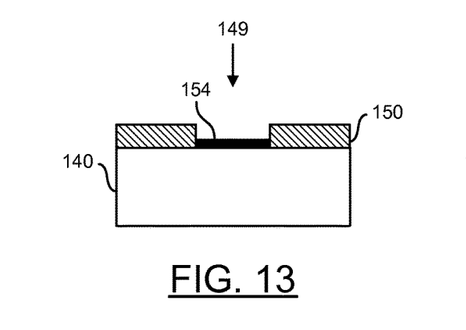

Referring to FIG. 13, a cross-sectional diagram of the wafer during a modified step 182 is shown. Instead of depositing the barrier layer 154 onto the epitaxial layer 150, front-side vias 149 may be etched through the epitaxial layer 150 to the substrate 140. The barrier layer 154 may be deposited and patterned into the front-side vias 149.

Figure 14:
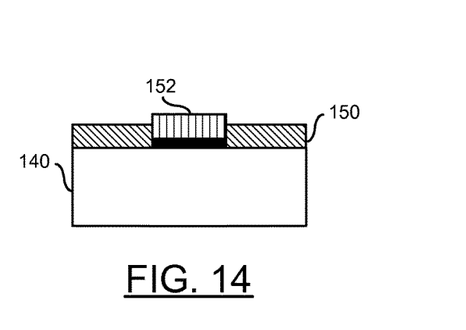

Referring to FIG. 14, a cross-sectional diagram of the wafer during a modified step 184 is shown. The metal layer 152 may be deposited and patterned on the barrier layer 150 inside the front-side vias 149.

Figure 15:
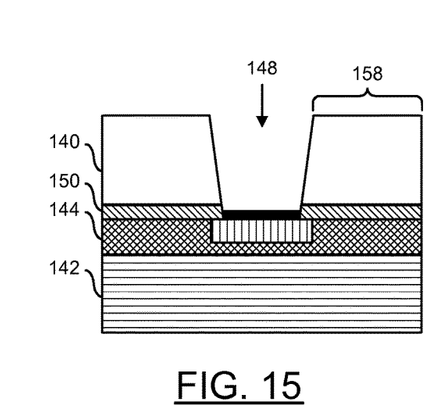

Referring to FIG. 15, a cross-sectional diagram of the wafer during the steps 102-108 is shown. The substrate 140 may subsequently be flipped and mounted to the handle substrate 142 in the step 102. In the step 104-108, a mask layer may be formed, the through-substrate vias 148 etched and the mask stripped, as in the method 100.

Figure 16:
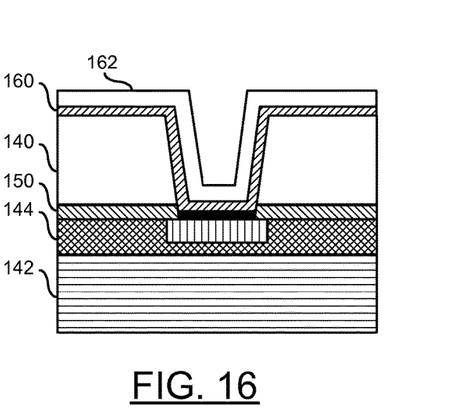

Referring to FIG. 16, a cross-sectional diagram of the wafer during the steps 120-130 is shown. In the step 120, the seed layer 160 may be sputtered onto the back surface of the substrate 140 and into the vias 148. The steps 122 to 130 may be similar to the same steps in the method 100. The back-metal layer 162 may be plated and the substrate 140 removed from the handle substrate 142 in the step 122 and 124. The substrate 140 may be cut into die, mounted and attached/alloyed in the steps 126, 128 and 130, respectively.

Figure 17:
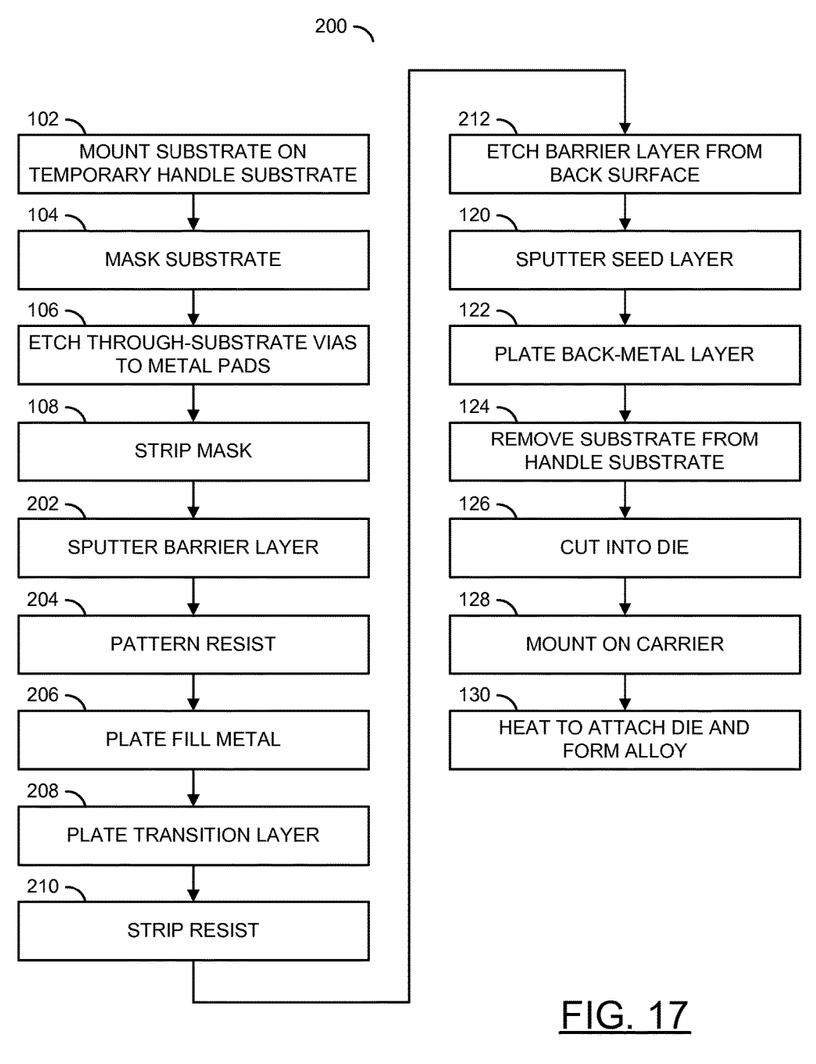
FIG. 17 is a flow diagram of a fabrication method.

Referring to FIG. 17, a flow diagram of a fabrication method 200 is shown. The method (or process) 200 generally implements a fabrication method used to create one or more die having through-substrate vias. The die may include, but are not limited to, high-frequency and/or high-performance transistors and integrated circuits. The method 200 may be a variation of the method 100 and/or the method 180.

The method 200 generally comprises the step 102, the step 104, the step 106, the step 108, a step (or state) 202, a step (or state) 204, a step (or state) 206, a step (or state) 208, a step (or state) 210, a step (or state) 212, the step 120, the step 122, the step 124, the step 126, the step 128 and the step 130. The steps 102-108, 202-212 and 120-130 may be implemented using common semiconductor fabrication equipment.

Referring again to FIG. 2, the substrate 140 may be flip mounted on the handle substrate 142 and masked per the steps 102 and 104. The through vias 148 are generally etched and the mask stripped in the steps 106 and 108.

Figure 18:
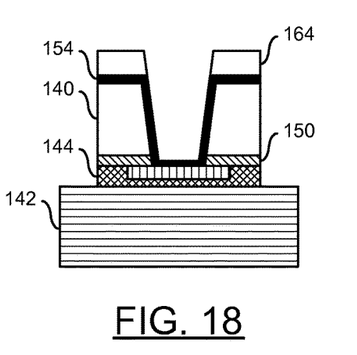
FIGS. 18-21 are cross-sectional diagrams of the wafer during the steps of the fabrication method of FIG. 17.

Referring to FIG. 18, a cross-sectional diagram of the wafer during the steps 202-204 is shown. In the step 202, the barrier layer 154 may be sputtered on the back side of the substrate 140. A photoresist 164 is generally deposited and patterned in the step 204 to leave the vias 148 exposed while the rest of the back side of the substrate 140 is covered with photoresist.

Figure 19:
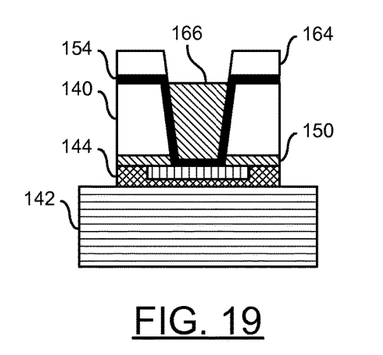

Referring to FIG. 19, a cross-sectional diagram of the wafer during the step 206 is shown. In the step 206, a fill metal 166 may be plated into the vias 148 to fill the vias 148. In some embodiments, copper may be used as the fill metal 166. In other embodiments, other metals with different (e.g., higher) eutectic temperatures, such as silver or palladium, may be used as the fill metal 166. The photoresist 164 may prevent the other areas on the back side of the substrate 140 from being plated.

Figure 20:
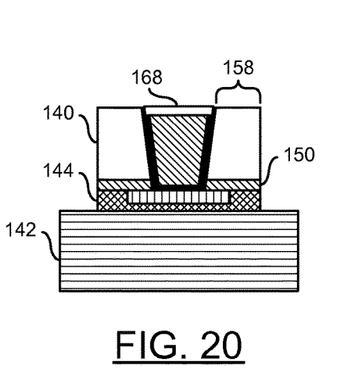

Referring to FIG. 20, a cross-sectional diagram of the wafer during the steps 208-212 is shown. In the step 208, a transition layer 168 may be plated over the fill metal 166. For example, the transition layer may comprise multiple layers of metal including, but not limited to, nickel (e.g., Ni), gold or other barrier layer materials. The nickle may prevent the fill metal 166 (e.g., copper) from mixing with the later-plated back-metal layer 162 (e.g., gold). The resist 164 may be stripped in the step 210. In the step 212, the barrier layer 154 may be etched from areas 158 of the back side of the substrate 140. The areas 158 may include some or all of the non-via areas on the back (outside) surface of the substrate 140.

Figure 21:
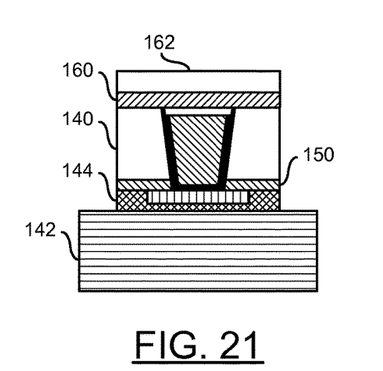

Referring to FIG. 21, a cross-sectional diagram of the wafer during the steps 120 and 122 is shown. In the step 120, the seed layer 160 may be deposited over the back surface of the substrate 140. The seed layer 160 generally serves a current-carrying roll in the subsequent plating of the back-metal layer 162. In the step 122, the back-metal layer 162 may be plated onto the seed layer 160.

Referring again to FIG. 17, the substrate 140 may be removed from the handle substrate 142, cut into die, mounted on a carrier and heated to attach the die and alloy the back-metal layer 162 to the substrate 140 in the areas 158, per the steps 124-130, respectively.

Combinations of the methods 100, 180 and 200 may also be implemented. For example, the steps 206 and 208 of the method 200 may be included in the methods 100 and/or 180 to fill the vias 148 prior to plating the back-metal layer 162. In another example, the front-side vias 149 (FIG. 13) may be created for a subset of the corresponding through-substrate vias 148. Therefore, the inside walls of some vias 148 may be lined with the barrier layer 154 while other vias 148 are not. Other combinations of the fabrication steps may be implemented to meet the criteria of a particular application.

The functions and structures illustrated in the diagrams of FIGS. 1-21 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. A method involving a barrier for preventing eutectic break-through in through-substrate vias, comprising the steps of:
   (A) forming one or more vias through a substrate, wherein said substrate comprises a semiconductor;
   (B) forming a first metal layer;
   (C) forming a barrier layer (i) between said vias and said first metal layer and (ii) on a side of said substrate opposite said first metal layer;
   (D) removing said barrier layer down to said substrate from one or more areas on said side of said substrate opposite said first metal layer; and
   (E) forming a second metal layer (i) in electrical contact with said first metal layer through said vias and said barrier layer, (ii) in electrical contact and physical contact with said substrate in said areas and (iii) configured to make contact with metalization on a carrier.

2. The method according to claim 1, wherein said second metal layer comprises gold and said semiconductor comprises silicon.

3. The method according to claim 1, further comprising the step of:
   heating said second metal layer and said substrate to form a eutectic alloy in said areas, wherein said eutectic alloy (i) is formed from said second metal layer alloying with said semiconductor and (ii) is configured to bond said substrate to said carrier.

4. The method according to claim 3, wherein said barrier layer has a composition configured to prevent (i) a breach of said barrier layer by said eutectic alloy and (ii) an intermix of said eutectic alloy with said first metal layer caused by said heating.

5. The method according to claim 3, wherein said barrier layer has a composition configured to prevent formation of an alloy between said second metal layer and said semiconductor inside said vias.

6. The method according to claim 3, wherein said barrier layer is removed from said one or more areas on said substrate prior to formation of said eutectic alloy.

7. The method according to claim 1, wherein said barrier layer is formed in said vias.

8. The method according to claim 1, further comprising the step of:
forming an epitaxial layer on said substrate, wherein (i) said barrier layer is formed on said epitaxial layer before said vias are formed and (ii) said first metal layer is formed on said barrier layer before said vias are formed.

9. The method according to claim 1, further comprising the steps of:
forming an epitaxial layer on said substrate; and
forming one or more additional vias through said epitaxial layer, wherein (i) said barrier layer is formed in said additional vias, and (ii) said first metal layer is formed in said additional vias and on said barrier layer.

10. The method according to claim 1, further comprising the step of:
filling said vias with a third metal layer prior to formation of said second metal layer.

11. An apparatus comprising:
a substrate that has one or more vias, wherein said substrate comprises a semiconductor;
a first metal layer;
a barrier layer (i) between said first metal layer and said vias and (ii) on a side of said substrate opposite said first metal layer;
one or more areas opened in said barrier layer down to said substrate on said side of said substrate opposite said first metal layer; and
a second metal layer (i) in electrical contact with said first metal layer through said vias and said barrier layer, (ii) in electrical contact and physical contact with said substrate in said areas and (iii) configured to make contact with metalization on a carrier.

12. The apparatus according to claim 11, wherein said second metal layer comprises gold and said semiconductor comprises silicon.

13. The apparatus according to claim 11, further comprising a eutectic alloy formed in said areas when said apparatus is heated, wherein said eutectic alloy (i) is formed from said second metal layer alloying with said semiconductor and (ii) is configured to bond said substrate to said carrier.

14. The apparatus according to claim 13, wherein said barrier layer has a composition configured to prevent (i) a breach of said barrier layer by said eutectic alloy and (ii) an intermix of said eutectic alloy with said first metal layer caused when said apparatus is heated.

15. The apparatus according to claim 13, wherein said barrier layer is has a composition configured to prevent formation of an alloy between said second metal layer and said semiconductor inside said vias.

16. The apparatus according to claim 13, wherein said barrier layer is removed from said areas on said substrate prior to formation of said eutectic alloy.

17. The apparatus according to claim 11, wherein said barrier layer is formed in said vias.

18. The apparatus according to claim 11, further comprising an epitaxial layer formed on said substrate, wherein (i) said barrier layer is formed on said epitaxial layer before said vias are formed and (ii) said first metal layer is formed on said barrier layer before said vias are formed.

19. The apparatus according to claim 11, further comprising an epitaxial layer formed on said substrate and one or more additional vias through said epitaxial layer, wherein (i) said barrier layer is formed in said additional vias, and (ii) said first metal layer is formed in said additional vias and on said barrier layer.

20. The apparatus according to claim 11, further comprising a third metal layer that fills said vias and resides between said first metal layer and said second metal layer.

* * * * *